(12) United States Patent
Wells

(10) Patent No.: US 11,570,932 B2
(45) Date of Patent: Jan. 31, 2023

(54) HEAT EXCHANGE RIBBON

(71) Applicant: ARRIS Enterprises LLC, Suwanee, GA (US)

(72) Inventor: James Stephen Wells, Flowery Branch, GA (US)

(73) Assignee: ARRIS Enterprises LLC, Suwanee, GA (US)

( * ) Notice: Subject to any disclaimer, the term of this patent is extended or adjusted under 35 U.S.C. 154(b) by 0 days.

(21) Appl. No.: 17/192,412

(22) Filed: Mar. 4, 2021

(65) Prior Publication Data

US 2021/0307191 A1  Sep. 30, 2021

Related U.S. Application Data

(60) Provisional application No. 62/993,926, filed on Mar. 24, 2020.

(51) Int. Cl.
*H05K 7/20* (2006.01)

(52) U.S. Cl.
CPC .................. *H05K 7/2039* (2013.01)

(58) Field of Classification Search
CPC .... G06F 1/20; H05K 7/20509; H05K 7/2039; H05K 2201/046; H01L 23/367; H01L 23/3672; H01L 2224/48091
See application file for complete search history.

(56) References Cited

U.S. PATENT DOCUMENTS

| | | | | |
|---|---|---|---|---|
| 4,508,163 A | * | 4/1985 | McCarthy | H01L 23/4093 257/713 |
| 4,552,206 A | * | 11/1985 | Johnson | H01L 23/4093 257/713 |
| 4,669,028 A | * | 5/1987 | Faa, Jr. | H01L 23/4006 174/16.3 |
| 5,648,893 A | * | 7/1997 | Loo | H01L 23/4006 257/E23.084 |
| 7,283,364 B2 | | 10/2007 | Refai-Ahmed et al. | |
| 9,668,335 B1 | * | 5/2017 | Canseco | F28F 3/02 |
| 2003/0035267 A1 | * | 2/2003 | Searls | H05K 7/20727 257/E23.105 |
| 2004/0206476 A1 | * | 10/2004 | Lee | H01L 23/3672 165/185 |
| 2005/0028967 A1 | | 2/2005 | Pedoeem et al. | |

(Continued)

OTHER PUBLICATIONS

International Search Report dated Jun. 21, 2021 in International (PCT) Application No. PCT/US2021/020870.

*Primary Examiner* — Adam B Dravininkas
(74) *Attorney, Agent, or Firm* — Wenderoth, Lind & Ponack, L.L.P.

(57) ABSTRACT

A heat exchange ribbon includes a base portion to be attached to a spacer to be mounted to a circuit board, a tail portion substantially parallel to the base portion, and a leg connecting the tail portion to the base portion. A height of the leg extends in the same direction as a height of the base portion and the tail portion so as to create an opening at least partially surrounded by the base portion, the leg, and the tail portion. The base portion, the tail portion, and the leg portion have a one-piece construction. The leg extends below a lower edge of the base portion such that at least a portion of the tail portion is located below a lower edge of the base portion, and at least a portion of an inner surface of the tail portion does not oppose the outer surface of the base portion.

18 Claims, 5 Drawing Sheets

(56) References Cited

U.S. PATENT DOCUMENTS

| | | | |
|---|---|---|---|
| 2006/0114655 A1 | 6/2006 | Wallace | |
| 2007/0206357 A1* | 9/2007 | Hellinger | H05K 7/205 |
| | | | 361/709 |
| 2010/0128444 A1* | 5/2010 | Wang | H01L 23/4006 |
| | | | 361/711 |
| 2012/0125588 A1 | 5/2012 | Nam et al. | |
| 2012/0160449 A1 | 6/2012 | Fowler et al. | |
| 2012/0309235 A1* | 12/2012 | Yuan | H01R 12/53 |
| | | | 439/660 |
| 2016/0315424 A1* | 10/2016 | Tsai | H01R 24/62 |
| 2016/0329646 A1* | 11/2016 | Tsai | H01R 13/6595 |
| 2018/0019186 A1 | 1/2018 | Kikugawa | |
| 2018/0323548 A1* | 11/2018 | Zhao | H01R 13/6581 |

* cited by examiner

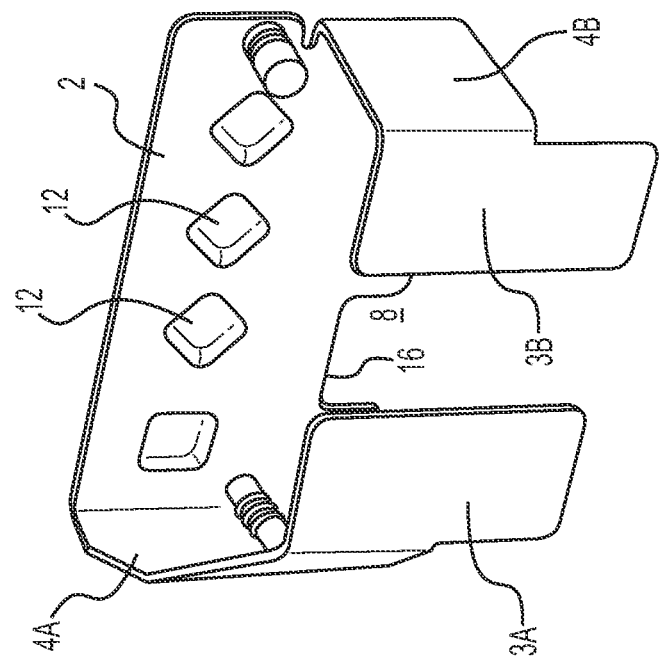
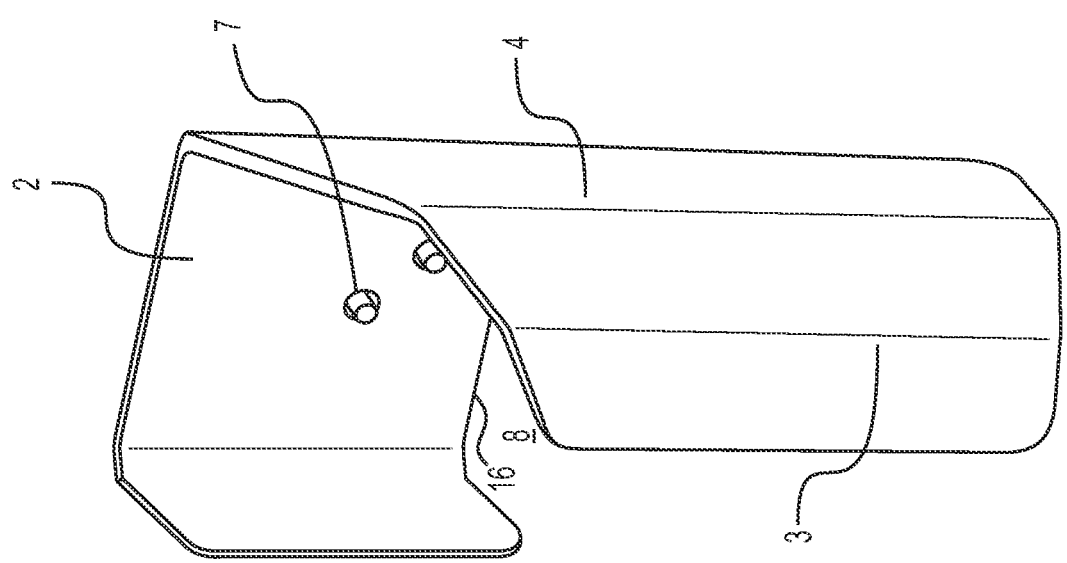

HEAT EXCHANGE RIBBON

BACKGROUND

Popular electronic apparatuses include modems and gateways, which can be in the form of a router, firewall, server, or other device to enable and control data flow. These apparatuses house electronic circuits that allow computers within a local network to send and receive data over the internet, filter inbound and outbound traffic, and/or filter traffic between two networks.

The electronic circuits may include circuit boards or panels on which interconnected circuits and other electronic components such as FEMs are mounted or printed. Because these electronic circuits produce a substantial amount of heat, thermal management techniques must be implemented to dissipate the heat so as to protect the components from performance degradation or damage.

Many WiFi-enabled gateway products include antennas located at the top of the enclosure to maximize WiFi performance. The circuits associated with the antennas are located directly below the antennas, and related SOC components and Ethernet circuits are nearby. As a result, approximately 80% of the power in a gateway may be concentrated in the top 20% of the enclosure, thereby increasing the difficulty of dissipating the generated heat.

Existing solutions for dissipating the generated heat involve mounting a heat sink with a flat base plate and vertical fins on top of a circuit board, thereby allowing heat to travel both horizontally across the flat base plate and upward along the vertical fins so as to be dispersed into cooler air.

However, the flat base plate of these types of existing solutions is in close proximity to the circuit board, covers components of the circuit board, and traps heat underneath such that the heat from higher-temperature components such as FEMs is concentrated near the circuit board. Furthermore, the fins of these types of existing solutions have limited surface areas which limit the amount of heat that can be dissipated. In addition, existing solutions are typically die cast or extruded designs entailing expensive manufacturing techniques. Therefore, existing solutions fail to optimally dissipate heat and are not cost-effective, particularly for electronic apparatuses such as modems and gateways.

Thus, it would be advantageous and an improvement over existing solutions to provide a heat exchanger that disperses heat away from both higher-temperature components and lower-temperature components of a circuit board and is less expensive to produce.

SUMMARY

To address the above-discussed problems, the present invention is directed to a heat exchange ribbon for dispersing heat within an enclosure housing a circuit board. The heat exchange ribbon includes a base portion to be attached to a spacer which is to be mounted to the circuit board within the enclosure, a tail portion substantially parallel (i.e., parallel within +/−10 degrees) to the base portion, and a leg connecting the tail portion to the base portion. The leg is configured so as to form an angle of less than 180 degrees with respect to each of the base portion and the tail portion, and a height of the leg extends in the same direction as a height of the base portion and the tail portion to create an opening at least partially surrounded by the base portion, the leg, and the tail portion. The base portion, the tail portion, and the leg portion can have a one-piece construction, and the leg can be configured such that the base portion is spaced at least 20 mm from the tail portion and is located within 5 mm of a wall of the enclosure so as to disperse heat away from the circuit board.

Each of the base portion and the tail portion can be planar (i.e., flat within acceptable industry tolerances), or the base portion can be planar and the tail portion can be corrugated (i.e., wavy). Furthermore, the heat exchange ribbon can include a first tail portion and a second tail portion, as well as a first leg and a second leg extending from opposite sides of the base portion so that each of the first leg and the second leg connect the base portion to a respective one of the first tail portion and the second tail portion.

A thickness of the heat exchange ribbon is within a range of 1 mm to 2 mm, and the base portion, the tail portion, and the leg can be formed out of aluminum sheet metal. Thus, the heat exchange ribbon is relatively light, and also has significant heat conduction properties. The leg can have a first straight section and a second straight section extending from the first straight section at an angle within a range of 120 to 150 degrees. A leg formed in this manner allows the heat exchange ribbon to be fitted within the tight confines of an enclosure of an electronic device. The base portion can have a plurality of dimple parts which are recessed at an outer surface of the base portion (i.e., a surface of the base portion facing away from the circuit board), and which protrude toward the circuit board at an inner surface of the base portion (i.e., a surface facing toward the circuit board) for engagement with a thermal interface material on the circuit board.

The leg of the heat exchange ribbon can extend below a height of a lower edge of the base portion (i.e., to create a semi-helical shape) such that at least part of the tail portion is located below a height of the lower edge of the base portion and such that at least part of the inner surface of the tail portion does not oppose (directly face) the outer surface of the base portion. More preferably, most of the inner surface of the tail portion does not oppose (directly face) the outer surface of the base portion (i.e., more of the inner surface of the tail portion does not oppose the outer surface of the base portion than does oppose the outer surface). The semi-helical shape of the heat exchange ribbon as described above ensures that the primary surfaces of the base potion, leg, and tail portion align with the laminar flow of the natural convection air, thereby improving heat dissipation effects.

The invention is also directed to a heat exchange apparatus for dispersing heat within an enclosure housing a circuit board, in which the heat exchange apparatus includes a heat exchange ribbon as described above, and a substrate to be mounted on the circuit board and having an opening. A spacer is also provided to be mounted on the circuit board within the enclosure, and the spacer is arranged within the opening of the substrate. The base portion of the heat exchange ribbon is attached to the spacer via a copper or aluminum fastener such as a rivet, a screw, or by solder or weld.

The opening of the substrate can be one of a plurality of openings in the substrate, and the spacer can be one of a plurality of spacers to be mounted on the circuit board. In that case, each of the spacers is fitted within a respective one of the openings of the substrate, the heat exchange ribbon is one of a plurality of heat exchange ribbons, and each of the heat exchange ribbons is attached to a respective one of the spacers.

The invention is also directed to an electronic device including an enclosure (housing), a circuit board housed within the enclosure and containing a variety of electronic components, and the heat exchange apparatus as described above for dispersing heat within the enclosure in which the circuit board is accommodated (housed). Again, the substrate can have a plurality of openings therein, and a plurality of spacers can be mounted on the circuit board. In that case, each of the spacers is fitted within a respective one of the openings of the substrate, and each of a plurality of the heat exchange ribbons as described above is attached to a respective one of the spacers.

As a result of the configuration of the heat exchange ribbon as described herein as well as the heat exchange apparatus which includes the heat exchange ribbon, heat from the circuit board and associated components will be conducted away from the circuit board and just outside of the associated EMI shield. More particularly, the configuration of heat exchange ribbon creates an opening at least partially surrounded by the base portion, the arm portion, and the tail portion so that the surfaces of the base portion, the leg, and the tail portion are all parallel to the laminar flow of natural convection within the enclosure. Thus, heat is conducted toward the bottom of the enclosure where the ambient temperature is relatively cool and out to the enclosure wall, so that dispersal of heat generated at a circuit board of an electronic device can be greatly improved. In particular, the present inventor experienced a reduction in temperature of 10 to 15 degrees for the critical electronic components on the circuit board when using the heat exchange ribbon described herein to disperse heat, as compared to the temperature reduction achieved when using conventional finned heat sinks and heat spreaders.

BRIEF DESCRIPTION OF THE DRAWINGS

FIGS. 1A and 1B are top perspective views of two exemplary heat exchange ribbons, in which FIG. 1A shows an example of a heat exchange ribbon with only one tail portion, and FIG. 1B shows an example of a heat exchange ribbon with two tail portions.

DETAILED DESCRIPTION

Exemplary embodiments will be described in detail below with reference to the drawings. The description and drawings are provided so that a person skilled in the art can fully understand the present disclosure and are not intended to limit the subject matter recited in the claims.

Figure 5:
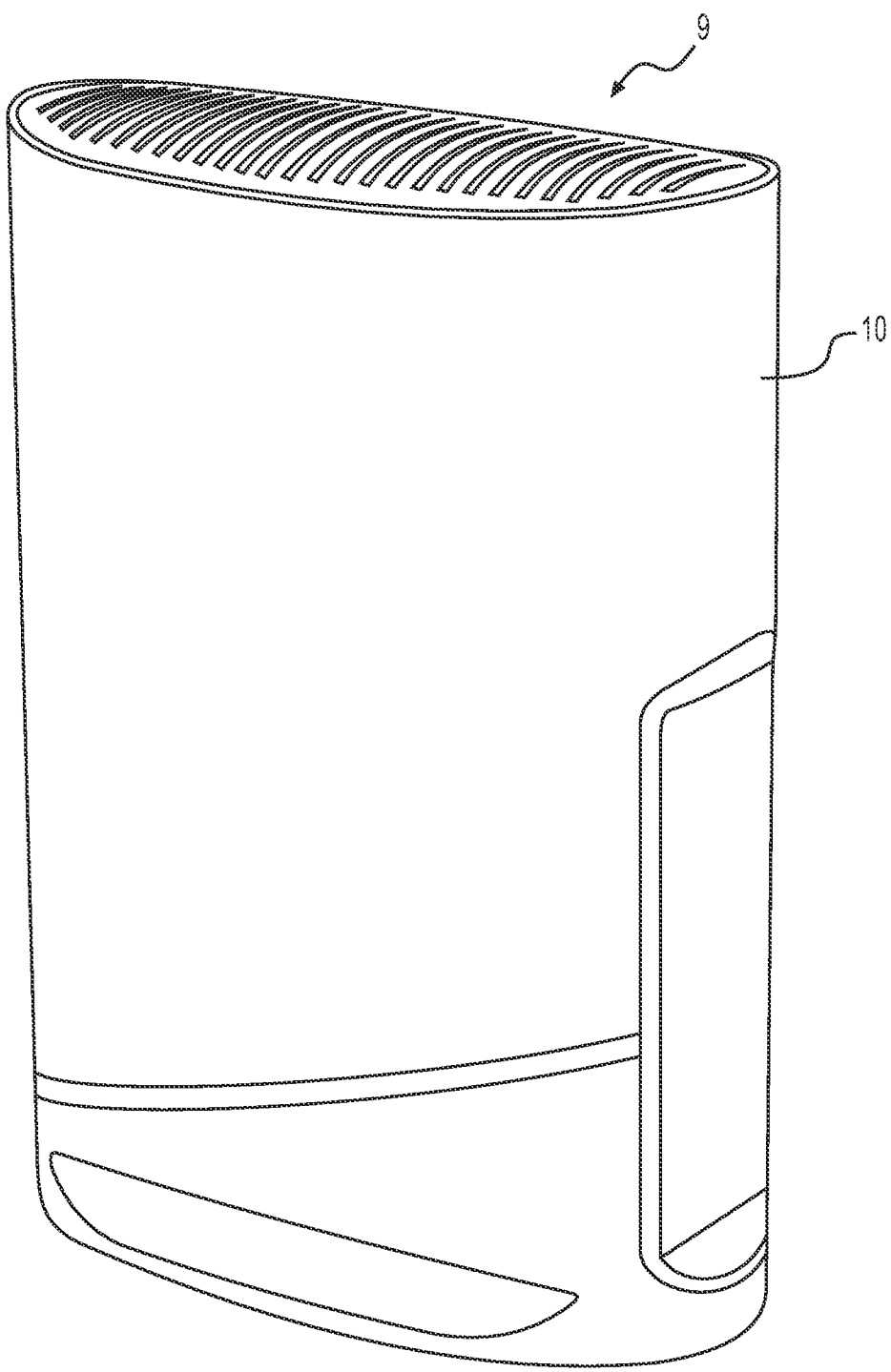
FIG. 5 is a perspective view of an exemplary electronic device.

As illustrated in FIGS. 1A and 1B, a heat exchange ribbon 1 is provided for dispersing heat within an enclosure 10 housing a circuit board 15 (see FIG. 5). The heat exchange ribbon 1 includes a base portion 2 to be attached to a spacer (slug) 5 which is to be mounted to the circuit board 15 within the enclosure 10, a tail portion 3 substantially parallel (i.e., parallel within +/−10 degrees) to the base portion 2, and a leg 4 connecting the tail portion to the base portion. The spacer 5 can be mounted to the circuit board 15 via thermal interface material 6, and has a fastener 7 for allowing attachment of the heat exchange ribbon 1 to the spacer 5 (see FIG. 2). The fastener 7 can be aluminum or copper material, and can be in the form of a rivet or some type of threaded fastener or mechanical clip for mechanically attaching the heat exchange ribbon 1 to the spacer 5, or can allow the heat exchange ribbon to be soldered or welded to the spacer.

Figure 4A:
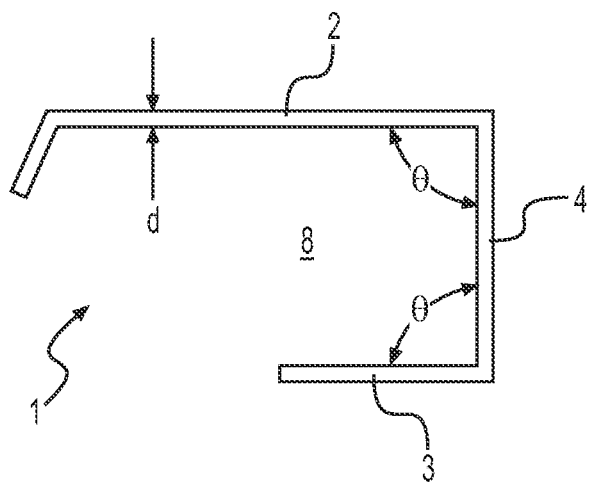
FIG. 4A is a plan view of an exemplary heat exchange ribbon.

As illustrated in the plan view of FIG. 4A, the leg 2 connects with each of the base portion 2 and the tail portion 3 so as to form an angle e of less than 180 degrees with respect to each of the base portion 2 and the tail portion 3. A thickness d of the heat exchange ribbon 1 is within a range of 1 mm to 2 mm, and all of the base portion 2, the tail portion 3, and the leg 4 can be formed out of the same one single integral sheet of aluminum metal such that the heat exchange ribbon 1 has a one-piece construction. In particular, aluminum sheet metal can be punched, sheared, or otherwise cut and then bent to form the heat exchange ribbon as one piece. Thus, the heat exchange ribbon 1 is relatively easily manufactured, is lightweight, and has excellent heat conduction properties.

Figure 4B:
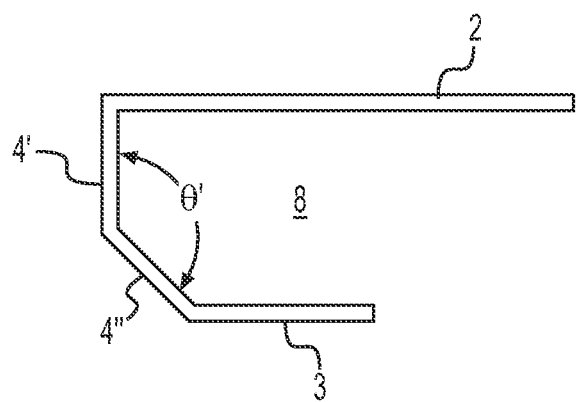
FIG. 4B is a plan view of another exemplary heat exchange ribbon.

FIG. 4B illustrates the leg 4 being bent to have a first straight section 4' and a second straight section 4" extending from the first straight section 4' at an angle θ' within a range of 120 to 150 degrees. Bending the leg 4 in such a manner allows the heat exchange ribbon 1 to fit within the confines of the enclosure 10 while also achieving the heat dissipation advantages of the heat exchange ribbon as described above. It is of course also possible that the leg 4 has a slight curvature rather than a sharp bend.

As shown in FIGS. 1A through 4B, the leg 4 is attached at a side of each of the base portion 2 and the tail portion 3 such that a height H of the leg 4 extends in the same direction as a height of the base portion 2 and the tail portion 3. The height direction in this case is a vertical direction along the circuit board from the top of the enclosure 10 and the top of the circuit board 15 to the base or bottom of the enclosure 10 and the base or bottom of the circuit board 15, parallel to the laminar flow during natural convection. In other words, the leg 4 does not extend orthogonal to the vertical direction such that a thickness direction of the leg 4 extends in the same direction as the height H of the base portion 2 and the height H of the tail portion 3. The arrangement of the base portion 2, leg 4, and tail portion 3 of the heat exchange ribbon 1 creates an opening 8 extending in the height direction which is at least partially surrounded by the base portion 2, the leg 4, and the tail portion 3, and the leg 4 does not block the opening 8 to prevent natural convection. Consequently, the main surfaces of the base portion 2, the leg 4, and the tail portion 3 will be parallel to the laminar flow of natural convection within the enclosure 10 and through the opening 8. Furthermore, the leg 4 is configured such that the base portion 2 is spaced at least 20 mm from the tail portion 3 and is spaced away from the tail portion 3 such a distance as to be located within 5 mm of a wall of the enclosure 10 so as to disperse heat away from the circuit board 15. Thus, the tail portion 3 will be located as far away as reasonably possible from the component on the circuit board 15 generating the heat. As a result, heat can be conducted toward the wall of the enclosure 10 and toward the bottom of the enclosure 10 where the ambient temperature is relatively cool, so that dispersal of heat within the enclosure 10 of an electronic device 9 can be greatly improved.

Each of the base portion 2 and the tail portion 3 can be planar (i.e., flat within acceptable industry tolerances). Alternatively, the base portion 2 can be planar and the tail portion 3 can be corrugated (i.e., wavy) so as to increase the surface area of the tail portion 3 (and, thus, the heat transfer area) while requiring roughly the same amount of space. As illustrated in FIG. 1B, the heat exchange ribbon 1 can include a first tail portion 4a and a second tail portion 4b, as well as a first leg 3a and a second leg 3b extending from opposite sides of the base portion 2 so that each of the first leg 3a and the second leg 3b connect the base portion 2 to a respective one of the first tail portion 4a and the second tail portion 4b.

Figure 3:
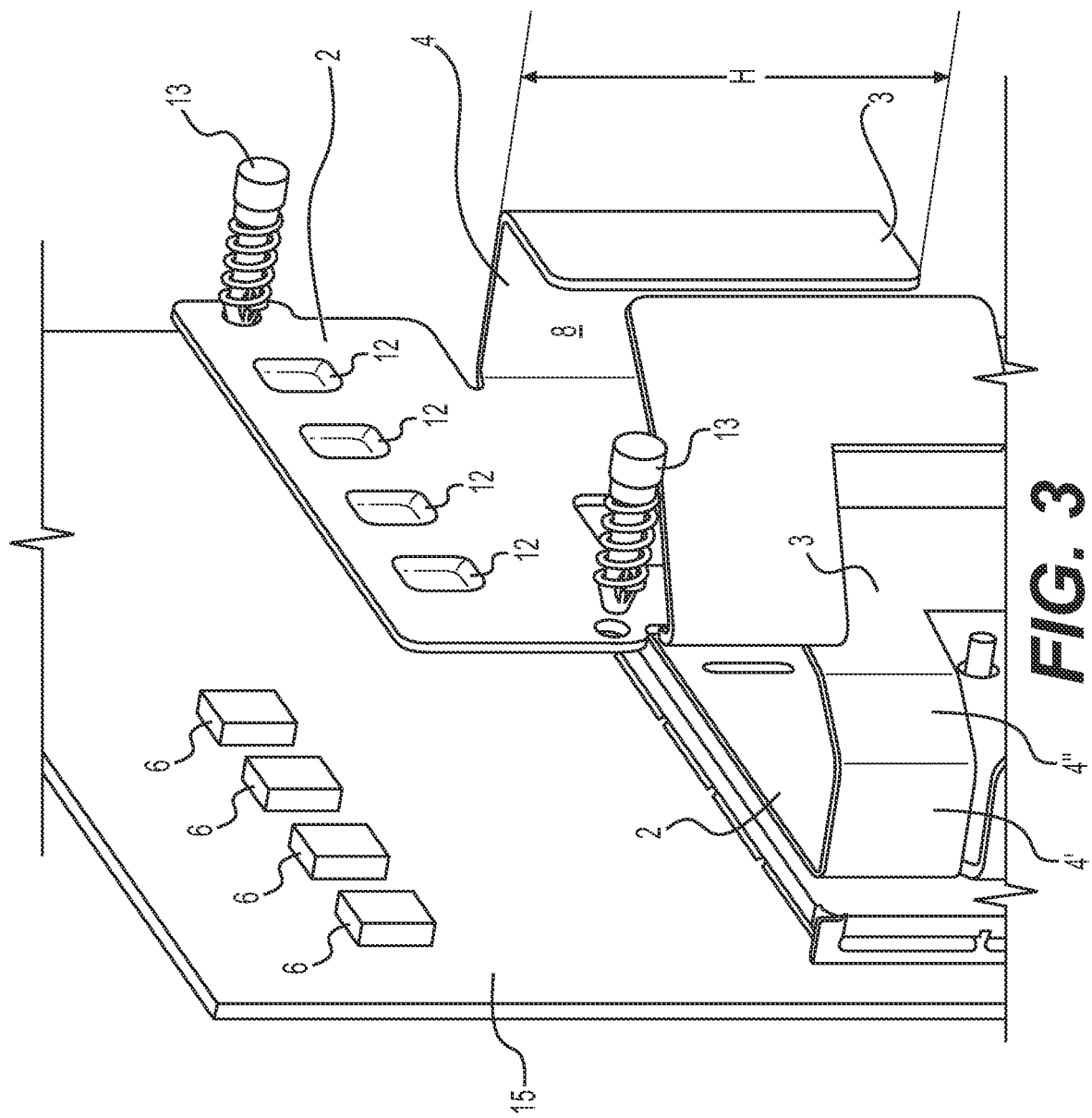
FIG. 3 is a perspective view of an exemplary heat exchange apparatus with multiple heat exchange ribbons.

As illustrated in FIG. 1B and FIG. 3, the base portion 2 can have dimple parts 12. These dimple parts 12 are recesses within the otherwise planar outer surface of the base portion 2 (i.e., the surface of the base portion 2 facing away from the circuit board 15), and projections on the otherwise planar inner surface of the base portion 2 (i.e., the surface facing toward the circuit board 15) which protrude toward the circuit board 15 and into thermal interface material 6 on the circuit board 15 to improve heat flow between the circuit board 15 and the heat exchange ribbon 1.

Figure 2:
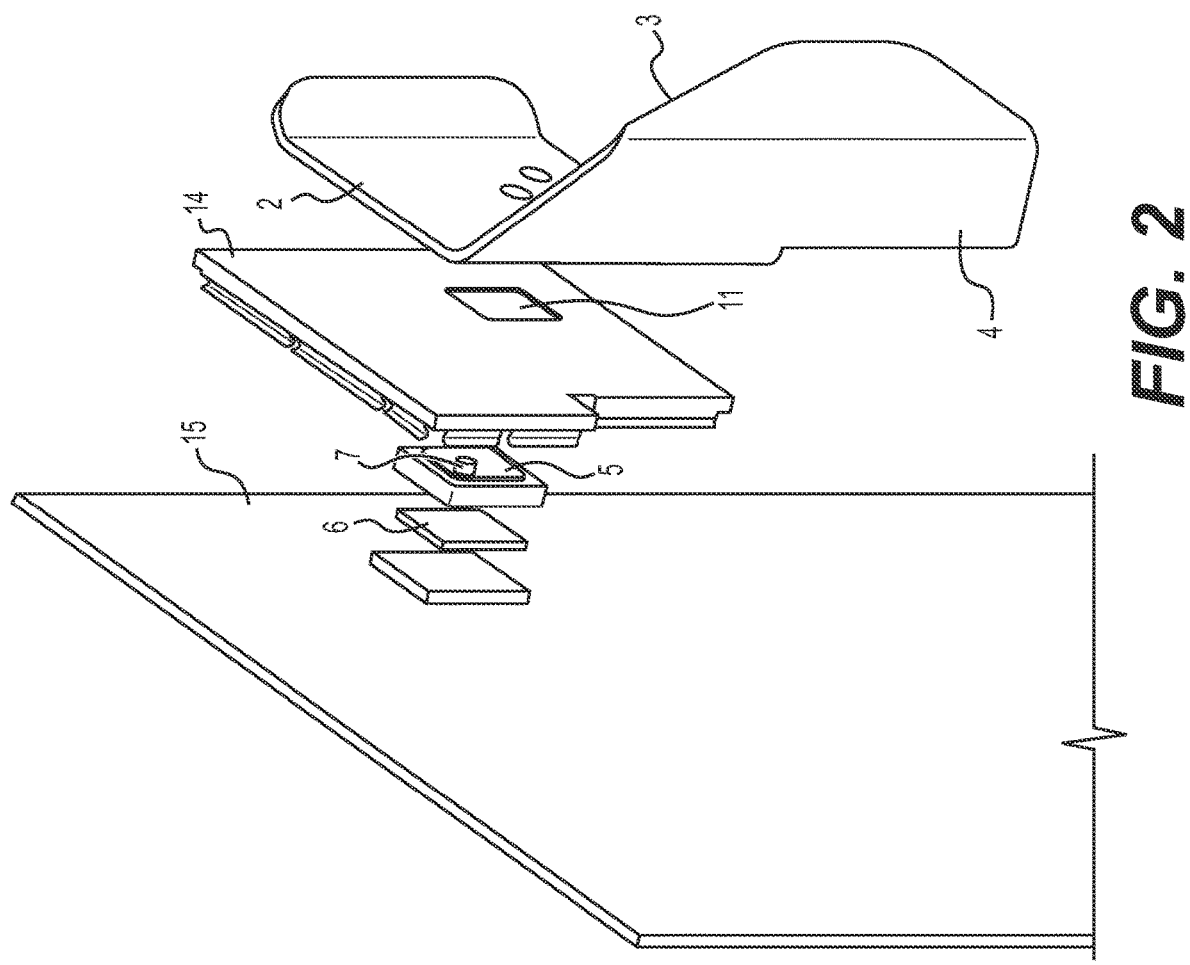
FIG. 2 is an exploded perspective view of an exemplary heat exchange ribbon and heat exchange apparatus.

As best illustrated in FIGS. 1A and 2, the leg 4 can extend below a height of a lower edge 16 of the base portion 2 in the vertical direction. As explained above, the "height" refers to the vertical direction along the circuit board 15 from the top of the enclosure 10 and the top of the circuit board 15 to the bottom of the enclosure 10 and the base or bottom of the circuit board 15, parallel to the laminar flow during natural convection. This extension of the leg 4 below the lower edge of the base portion 2, coupled with the configuration and orientation of the tail portion 3, creates a heat exchange ribbon 1 with a semi-helical shape as shown in FIG. 1A. With such a shape, at least a portion of the tail portion 3 is located below a height of the lower edge 16 of the base portion 2, and therefore at least a portion of the inner surface of the tail portion 3 does not oppose (face) the outer surface of the base portion 2. More preferably, most of the inner surface of the tail portion 3 does not oppose (directly face) the outer surface of the base portion 2. In other words, preferably, more of the inner surface of the tail portion 3 does not oppose the outer surface of the base portion 2 than does oppose the outer surface of the base portion 2. This arrangement further serves to conduct heat flow away from the circuit board 15 and toward the bottom of the enclosure 10. The semi-helical shape of the heat exchange ribbon 1 as described above orients the primary surfaces of the base portion 2, the leg 4, and the tail portion 3 in line with the laminar flow of the natural convection air.

A heat exchange apparatus of the present invention is to be mounted within the enclosure 10 shown in FIG. 5. The heat exchange apparatus includes a heat exchange ribbon 1 as described above, as well as a spacer 5 and a substrate 14 to be mounted on the circuit board 15. As illustrated in the exploded view of FIG. 2, the substrate 14 has an opening 11 for receiving the spacer 5, and both the substrate 14 and the spacer 5 are mounted to the circuit board 15. The spacer 5 is mounted to the circuit board 15 via, for example, thermal interface material 6 to improve the conduction of heat. The base portion 2 of the heat exchange ribbon 1 can be mounted to the circuit board 15 by push pins 13, as shown in FIG. 3, and is also attached to the spacer 5 via a copper or aluminum fastener 7 such as a rivet or threaded connector such as a screw, or by soldering or welding or another known method. The manner of attachment of the base potion 2 to the spacer 5 should be sufficient to promote conduction of heat from the spacer 5 to the heat exchange ribbon 1.

The substrate 14 is not limited to having only one opening 11 for receiving a spacer 5, and instead the substrate 14 can have multiple openings 11. In this case, multiple spacers 5 are mounted on the circuit board 15, and each of the spacers 5 is fitted within a respective one of the openings 11 in the substrate 14. A respective heat exchange ribbon 1 is then attached to each of the spacers 5 such that there is a one-to-one correspondence between spacers 5 and heat exchange ribbons 1 (see FIG. 3).

An electronic device 9 such as a gateway or a modem includes an enclosure (housing) 10, as shown in FIG. 5. The electronic device 9 includes a circuit board 15 housed within the enclosure 10, as well as a variety of heat-generating electronic components such as antennas, WiFi circuits, a SOC, and Ethernet circuits. To dissipate the heat generated by such components, the electronic device 9 also includes the heat exchange apparatus described above within the enclosure 10 in which the circuit board is accommodated (housed). As described above, the substrate 14 can have multiple openings 11 for receiving a respective spacer 5, and the spacers 5 can be mounted on the circuit board 5 along with the substrate 14. One of the heat exchange ribbons 1 as described above is attached to each respective one of the spacers 5. Thus, the heat exchange ribbon 1 described above can serve to efficiently conduct heat generated by the electronic components

The invention claimed is:

1. A heat exchange ribbon for dispersing heat within an enclosure housing a circuit board, the heat exchange ribbon comprising:
    a base portion configured to be attached to a spacer to be mounted to the circuit board within the enclosure;
    a tail portion substantially parallel to said base portion; and
    a leg connecting said tail portion to said base portion, said leg being configured so as to form an angle of less than 180 degrees with respect to each of said base portion and said tail portion, and so that a height of said leg extends in the same direction as a height of said base portion and said tail portion to create an opening at least partially surrounded by said base portion, said leg, and said tail portion,
    wherein an entirety of said tail portion is planar,
    wherein said base portion, said tail portion, and said leg portion have a one-piece construction,
    wherein said base portion has an outer surface to face away from the circuit board, and said tail portion has an inner surface to face toward the circuit board, said leg extending below a lower edge of said base portion such that at least a portion of said tail portion is located below a lower edge of said base portion and such that at least a portion of said inner surface of said tail portion does not oppose said outer surface of said base portion, and
    wherein said base portion, said leg, and said tail portion are configured such that a portion of said inner surface of said tail portion not opposing said outer surface of said base portion 1s larger than a portion of said inner surface of said tail portion opposing said outer surface of said base portion.

2. The heat exchange ribbon of claim 1, wherein said base portion is planar.

3. The heat exchange ribbon of claim 1, wherein a thickness of said heat exchange ribbon is within a range of 1 mm to 2 mm.

4. The heat exchange ribbon of claim 1, wherein said base portion has a plurality of dimple parts configured to protrude toward the circuit board for engagement with a thermal interface material.

5. The heat exchange ribbon of claim 1, wherein said tail portion is a first tail portion and said leg is a first leg, said heat exchange ribbon further comprising a second tail portion and a second leg, said first leg and said second leg extending from opposite sides of said base portion and each of said first leg and said second leg connecting said base portion to a respective one of said first tail portion and said second tail portion.

6. The heat exchange ribbon of claim 1, wherein said base portion, said tail portion, and said leg are formed out of aluminum sheet metal.

7. The heat exchange ribbon of claim 1, wherein said leg is configured such that said base portion is spaced at least 20 mm from said tail portion and is to be located within 5 mm of a wall of the enclosure to disperse heat away from the circuit board.

8. A heat exchange apparatus for dispersing heat within an enclosure housing a circuit board, the heat exchange apparatus comprising:
  a substrate to be mounted on the circuit board and having an opening;
  a spacer to be mounted on the circuit board within the enclosure, said spacer being arranged within said opening of said substrate, said spacer having a fastener thereon; and
  a heat exchange ribbon including:
    a base portion attached to said spacer via said fastener;
    a tail portion substantially parallel to said base portion; and
    a leg connecting said tail portion to said base portion, said leg being configured so as to form an angle of less than 180 degrees with respect to each of said base portion and said tail portion, and so that a height of said leg extends in the same direction as a height of said base portion and said tail portion to create an opening at least partially surrounded by said base portion, said leg, and said tail portion,
    wherein said base portion, said tail portion, and said leg of said heat exchange ribbon have a one-piece construction, and
  wherein said base portion has an outer surface to face away from the circuit board, and said tail portion has an inner surface to face toward the circuit board, said leg extending below a lower edge of said base portion such that at least a portion of said tail portion is located below a lower edge of said base portion and such that at least a portion of said inner surface of said tail portion does not oppose said outer surface of said base portion.

9. The heat exchange apparatus of claim 8, wherein said base portion is planar and said tail portion is corrugated.

10. The heat exchange apparatus of claim 8, wherein said opening of said substrate is one of a plurality of openings of said substrate, said spacer is one of a plurality of spacers to be mounted on the circuit board, each of said plurality of spacers being arranged within a respective one of said openings of said substrate, and said heat exchange ribbon is one of a plurality of heat exchange ribbons, each of said plurality of heat exchange ribbons being attached to a respective one of said spacers.

11. The heat exchange apparatus of claim 8, wherein said base portion has a plurality of dimple parts configured to protrude toward the circuit board for engagement with a thermal interface material.

12. The heat exchange apparatus of claim 8, wherein said leg has a first straight section and a second straight section extending from said first straight section at an angle within a range of 120 to 150 degrees.

13. The heat exchange apparatus of claim 8, wherein said base portion, said tail portion, and said leg portion are formed out of aluminum sheet metal.

14. The heat exchange apparatus of claim 8, wherein said leg is configured such that said base portion is spaced at least 20 mm from said tail portion and is to be located within 5 mm of a wall of the enclosure to disperse heat away from the circuit board.

15. An electronic device comprising:
  an enclosure;
  a circuit board housed within said enclosure; and
  a heat exchange apparatus for dispersing heat within said enclosure housing said circuit board, said heat exchange apparatus including:
    a substrate mounted on said circuit board and having an opening;
    a spacer mounted on said circuit board within said enclosure, said spacer being arranged within said opening of said substrate, said spacer having a fastener thereon; and
    a heat exchange ribbon including:
      a base portion attached to said spacer via said fastener;
      a tail portion substantially parallel to said base portion; and
      a leg connecting said tail portion to said base portion, said leg being configured so as to form an angle of less than 180 degrees with respect to each of said base portion and said tail portion, and so that a height of said leg extends in the same direction as a height of said base portion and said tail portion to create an opening at least partially surrounded by said base portion, said leg, and said tail portion,
      wherein said base portion, said tail portion, and said leg of said heat exchange ribbon have a one-piece construction, and
    wherein said base portion has an outer surface facing away from said circuit board, and said tail portion has an inner surface facing toward said circuit board, said leg extending below a lower edge of said base portion such that at least a portion of said tail portion is located below a lower edge of said base portion and such that at least a portion of said inner surface of said tail portion does not oppose said outer surface of said base portion.

16. The electronic device of claim 15, wherein said opening of said substrate is one of a plurality of openings of said substrate, said spacer is one of a plurality of spacers to be mounted on the circuit board, each of said plurality of spacers being arranged within a respective one of said openings of said substrate, and said heat exchange ribbon is one of a plurality of heat exchange ribbons, each of said plurality of heat exchange ribbons being attached to a respective one of said spacers.

17. The electronic device of claim 15, wherein said base portion has a plurality of dimple parts configured to protrude toward said circuit board and engage with a thermal interface material on said circuit board.

18. The electronic device of claim 15, wherein said leg is configured such that said base portion is spaced at least 20 mm from said tail portion and is located within 5 mm of a wall of said enclosure to disperse heat away from the circuit board.

\* \* \* \* \*